United States Patent [19]

Levine

[11] 4,223,234
[45] Sep. 16, 1980

[54] REDUCTION OF SPARKLE NOISE AND MOTTLING IN CCD IMAGERS

[75] Inventor: Peter A. Levine, Trenton, N.J.

[73] Assignee: RCA Corporation, New York, N.Y.

[21] Appl. No.: 35,346

[22] Filed: May 2, 1979

[51] Int. Cl.³ .................. G11C 19/28; H01L 29/78; H01L 27/14; H01L 29/04
[52] U.S. Cl. ................ 307/221 D; 357/24; 357/30; 357/59; 307/362
[58] Field of Search ............ 357/24, 30, 59; 307/221 D

[56] References Cited

U.S. PATENT DOCUMENTS

| | | | |
|---|---|---|---|
| 3,931,945 | 1/1976 | Levine | 357/24 |
| 3,943,545 | 3/1976 | Kim | 357/24 |
| 4,009,333 | 2/1977 | Berger et al. | 357/24 |
| 4,132,903 | 1/1979 | Graham | 357/24 |

FOREIGN PATENT DOCUMENTS 2259437  8/1975  France ................... 357/24

OTHER PUBLICATIONS

Rodgers "A 512×320 Element Silicon Imaging Device", IEEE Int. Solid-State Circuits Conf. (2/75), Dig. Tech. Papers, pp. 118-189.

*Primary Examiner*—Gene M. Munson
*Attorney, Agent, or Firm*—Samuel Cohen; George J. Seligsohn

[57] ABSTRACT

In a CCD imager of the single-layer electrode type wherein the gate electrodes are of one conductivity and the "gaps" between electrodes are of opposite conductivity type, sparkle and mottling are reduced by controlling the conductivity of the gaps. Such control is achieved by employing an overlying control electrode which is insulated from the gaps and gate electrodes, to which an adjustable control voltage is applied. The latter can be derived in open-loop fashion; however, in a preferred form of the invention, the leakage current between a pair of adjacent electrodes is sensed and employed to control a voltage which is fed back to the control electrode.

7 Claims, 9 Drawing Figures

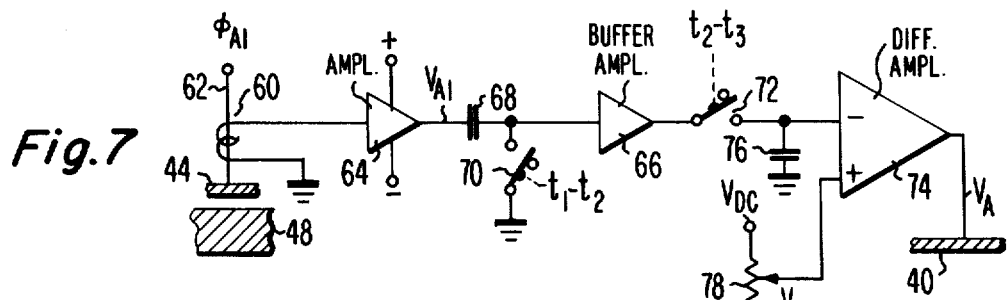
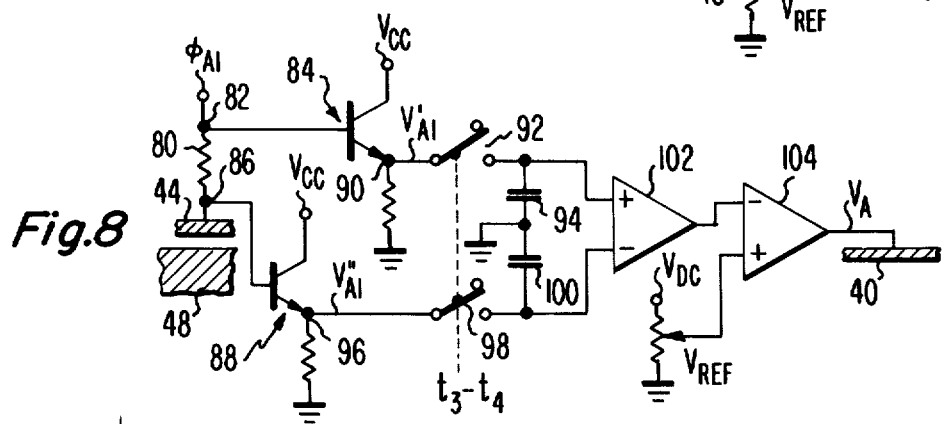
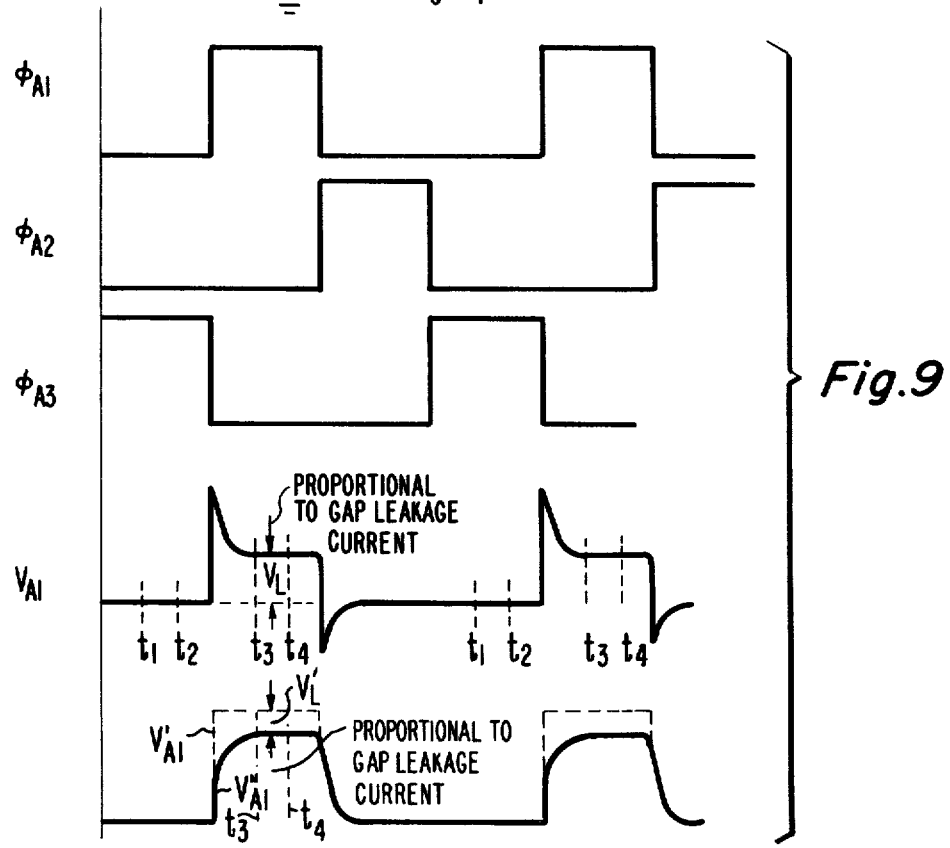

REDUCTION OF SPARKLE NOISE AND MOTTLING IN CCD IMAGERS

The present invention relates to charge-coupled device (CCD) imagers of the field transfer type and particularly, to the reduction of mottling and sparkle noise in imagers of this type which employ single-layer electrode structures.

In the drawing:

FIG. 7 is a schematic diagram of another embodiment of the invention;

FIG. 8 is a schematic diagram of another embodiment of the invention; and

FIG. 9 is a drawing of waveforms referred to in the explanation of the operation of FIGS. 7 and 8.

Figure 1:
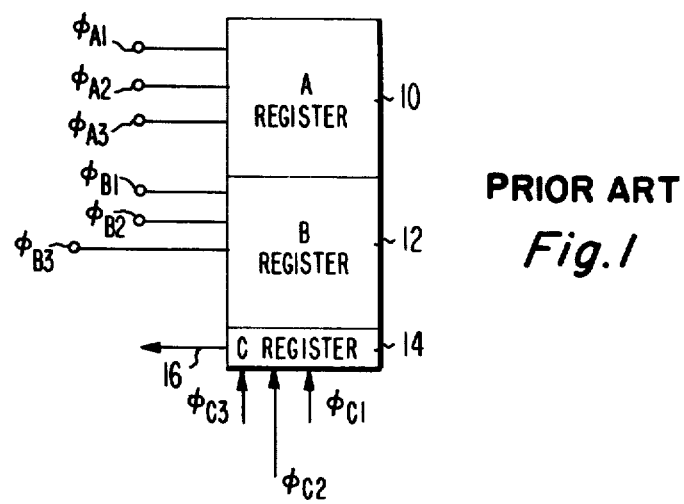
FIG. 1 is a block diagram of a known CCD imager of the field transfer type.

The system of FIG. 1, a CCD imager of the field transfer type, includes a photosensing array 10, known as an A register, a temporary storage array 12, known as a B register, and an output register 14, known as a C register. The B and C registers are masked, that is, means (not shown) are provided for preventing a radiant energy image from reaching either register.

Figure 2:
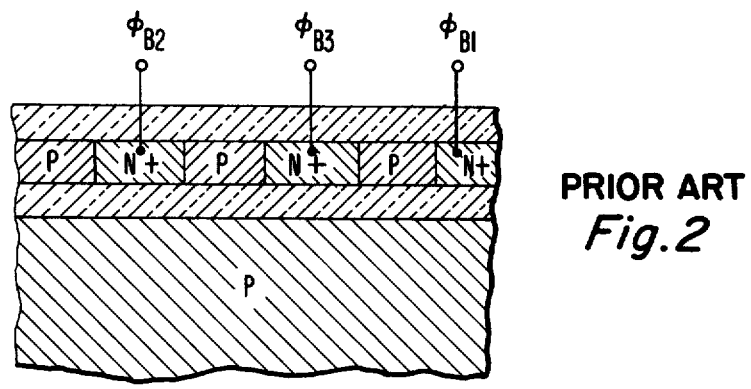
FIG. 2 is a section through the A register of the imager of FIG. 1 illustrating the single-layer electrode structure employed.

The A and B registers have channel stops (those in the B register are illustrated, in part, in FIG. 3) extending in the column direction to isolate the channels (the columns of the CCD) from one another. The electrodes (shown in FIG. 2) are of the single-layer type comprising, for example, N+ type regions of polysilicon separated by P-type regions of polysilicon as described in copending U.S. application Ser. No. 651,127 for "Charge Coupled Device Electrode Structure," filed Jan. 21, 1976, by R. L. Rodgers, 3rd and W. N. Henry and assigned to the same assignee as the present application. The imager can be two, three, four or higher phase operated. One such imager employing the single-layer electrode structure described is commercially available from RCA Corporation and is known as the SID 52501, or the "Big Sid." This imager is three-phase operated and has 320 columns and 512 rows (256 in the A register and 256 in the B register).

The operation of the array of FIG. 1 is well understood. During the so-called integration time, a scene or other image is projected onto the A register. The light or other radiant energy of the image causes charges to be produced at the various locations of the A register, in accordance with the light intensity reaching the respective locations. Assuming an N channel (P-type substrate) CCD, the charges can be stored, for example, beneath the $\phi_{A2}$ electrodes which may be held at +5 volts while the $\phi_{A1}$ and $\phi_{A3}$ electrodes are held at a voltage, such as −4 volts, which is more negative than the substrate voltage of say −2 volts. Maintaining the $\phi_{A1}$ and $\phi_{A3}$ electrodes at voltages more negative than the P-type substrate during the integration time provides operational blooming control as described in U.S. Pat. No. 3,931,465 issued to the present inventor on Jan. 6, 1976.

The above can be the voltage levels for one field of a frame and, if desired, for the following integration field, the electrodes to which the voltages are applied may be changed (i.e., +3 volts to the $\phi_1$ electrodes and −4 volts to the $\phi_2$ and $\phi_3$ electrodes) to obtain vertical interlacing, as understood in the art.

Upon the completion of the integration time (e.g., during the vertical blanking interval of commercial television), the charge signals which have accumulated (a "field") are transferred, in parallel, in the column direction from the A to the B register by the application of the multiple phase voltages $\phi_{A1} \ldots \phi_{AN}$ and $\phi_{B1} \ldots \phi_{N}$, where N is an integer equal to the number of phases employed. The charges subsequently are transferred, a row at a time, from the B register to the C register, and after each row of charges reaches the C register, it is serially shifted out of the C register in response to the shift voltages $\phi_{C1} \ldots \phi_{CN}$. The transfer of charges from the B to the C register occurs during a relatively short time (the horizontal retrace time of commercial television, which is about 10 µs) and the serial shifting of the C register occurs at relatively high speed (during the horizontal line display time of commercial television). During the transfer of a field from the B to the C register, a new field may be integrated in the A register.

Figure 3:
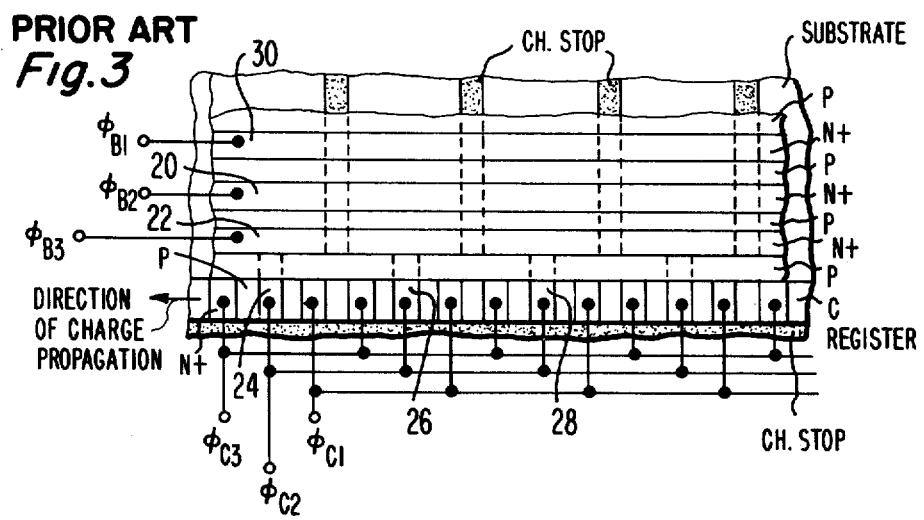
FIG. 3 is a plan view of a portion of the B register and a portion of the C register of the imager of FIG. 1.

FIG. 3 shows, in more detail, a portion of the B register which is close to the C register and a portion of the C register of FIG. 1. During the horizontal line display time, the charges which previously have been shifted into the C register are propagated at high speed out of the C register by the multiple-phase voltages $\phi_{C1}, \phi_{C2}$ and $\phi_{C3}$. During this display time (about 53.5 µs), which is roughly 84% of the horizontal line time (63.5 µs), the next row of charges is stored in the substrate region beneath the $\phi_{B2}$ electrode 20 of the B register. During this period the $\phi_{B2}$ voltage is a positive value such as +10 volts and the $\phi_{B1}$ and $\phi_{B3}$ voltages are of a less positive value such as 0 volts. The P-type substrate may be biased at a value such as −2 volts or so, as already indicated.

Upon the completion of the readout of the C register, it is necessary to transfer a new row of charges into the C register. This is accomplished by making the $\phi_{B2}$ voltage low while concurrently making the $\phi_{B3}$ voltage high. These and other details of the operation of the imager illustrated may be found in copending application Ser. No. 016,108 for "Reduction of 'Sparkle' Noise in CCD Imagers," filed Feb. 28, 1979 by the present inventor and assigned to the same assignee as the present application.

The serially occurring charges shifted out of the C register (at 16, FIG. 1) are translated to voltages and these may correspond to the video signals of television. These may be employed to intensity modulate the electron beam of a kinescope for displaying on its screen the image read from the imager.

It is found, in a system of this kind, that if no precautions are taken, the displayed image often exhibits so-called "sparkle" noise. Sparkle appears randomly at different places on the television screen as small regions which suddenly scintillate or sparkle, that is, which suddenly light up at high intensity and then disappear, sometimes at several places at a time, and which continuously reappear in random locations. Although these light spots are minute, they are disturbing. In addition, vertical differentiation appears in the image, that is, one edge, say the upper edge, of a small area of the picture may appear bright and the bottom edge dark, corresponding to overshoot of the video in one sense at the lagging edge of a video pulse and of the opposite sense at the leading edge of this video pulse. This, too, is disturbing to the eye.

The reason for sparkle is not fully understood. The present inventor is certain that it has something to do with charging of the P-type interelectrode regions, hereafter termed the "gaps," of the B register, during the shifting of the charge from the B to the C register, but the complete mechanism is not clear. He believes that a gap (which, in operation, is highly insulating) may become charged when the PN junction separating a P from an N+ region becomes forward biased and may then float when the PN junction becomes reverse biased. The $\phi_{B2}$ waveform is "on" (relatively positive) for about 84% of a horizontal line time, and the other two voltages $\phi_{B1}$ and $\phi_{B3}$ employed to operate the B register are each on for only roughly 8% of the time, and all of these voltages are driven between the same limits (0 to +10 volts in the example shown). The present inventor believes that this asymmetry in the waveforms results in asymmetries in the way in which the respective gaps in the B register become charged and that these asymmetries result in the random sparkle effects. Further discussion of sparkle and of one solution to this problem appears in the copending application identified above.

It also has been found in the system of the type described, that under certain circumstances so-called "mottling" occurs in the reproduced image. The mottling is manifested in an image as relatively dark areas appearing within areas which should be white. The mottled areas also appear to flicker slightly. This mottling is accompanied by degraded vertical resolution in the reproduced image. It has further been found that the mottling is strongly temperature dependent, becoming much more pronounced at relatively low temperatures than at room temperature.

The present inventor believes that the mottling also is due to gap charging and he believes that this gap charging occurs in the A register. According to this theory, when a gate electrode in the A register is relatively negative, the PN junction between that electrode and the gap becomes forward biased so that it presents a low impedance and the gap becomes charged relatively negatively through this low impedance. The negative charge in the gap creates a potential barrier beneath that gap. Upon the termination of the integration time, an electrode which formerly was negative is driven positive in an attempt to propagate a charge to the potential well created beneath that electrode. However, the positive voltage applied to the gate electrode reverse biases the PN junction and in view of the high impedance at the junction, it takes considerable time for the gap which was negatively charged to become positively charged. During the part of the A-to-B register transfer time required for the gaps to become positively charged, some of the charge which is attempted to be propagated from beneath one gate electrode to beneath the following gate electrode cannot propagate over the barrier beneath the gap between these two electrodes and vertical resolution is lost. This loss in resolution occurs along with the mottling described above.

At room temperature, the problem of loss of vertical resolution described above can be solved by delaying the transfer of charge from the A to the B register until the negatively-charged gaps become more positive. At room temperature this change in the gap charge to a more positive level can be achieved by inserting a delay of about 50 μs or so. However, it is found that as the operating temperature decreases, the impedance of the reverse biased junction increases correspondingly and this increases the time required to charge the gaps positively. When the temperature become sufficiently low, say of the order of 0° C. to −10° C., the amount of delay which would be required to allow the gaps to charge positively would be such that it would become impractical for some applications. For example, delaying the start of the A-to-B register transfer to solve the mottling problem at very low temperatures is not a practical approach in the case of commercial television.

As discussed in the copending application, the sparkle problem by itself can be solved by applying a DC bias to one or more of the electrodes in the B register. However, the bias level chosen is suitable only over a relatively restricted operating temperature range. If operating outside of this range, the bias level must be changed to a new value to maintain the sparkle at a relatively low level.

Figure 4:
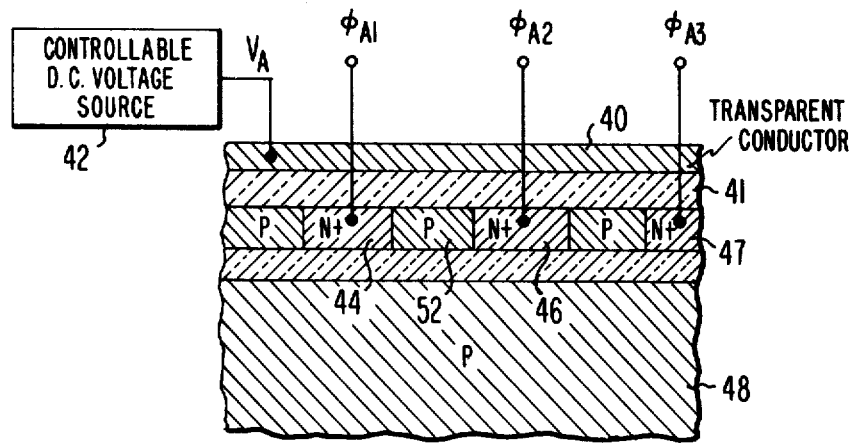
FIG. 4 is a section through the A register of a CCD imager which illustrates an embodiment of the invention.

FIG. 4 illustrates a structure embodying the invention as applied to the A register. In addition to the structure shown in FIG. 2, the FIG. 4 structure includes a transparent electrode 40 which is insulated from and overlies the gate electrodes. The insulation layer 41 may be formed of silicon dioxide or other material and may be thermally grown or deposited. A controllable DC voltage $V_A$ is applied to electrode 40 from the voltage source 42. The latter may simply be a potentiometer across which a voltage difference is maintained with the voltage $V_A$ being taken from a tap on the potentiometer. The voltage $V_A$ normally will be a positive voltage level for the case of a surface channel, P-type substrate CCD.

Figure 6:
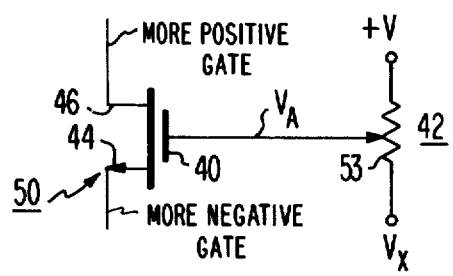
FIG. 6 is a schematic diagram to help illustrate the theory of operation of the invention.

The theory of operation is illustrated in FIG. 6. During the integration time, assume that $\phi_{A2}$ electrodes are integrating electrodes and are maintained at a relatively positive level and the $\phi_{A1}$ and $\phi_{A3}$ electrodes are maintained at a relatively negative voltage level, as already described. The P-type substrate 48 may also be at a negative voltage level but not as negative as the $\phi_{A1}$ and $\phi_{A3}$ levels. Taking any set of two adjacent electrodes, such as 44 and 46, as an example, they operate as the source and drain electrodes, respectively, of an N-channel, field-effect transistor 50 with the gap 52 operating as the conduction channel of the transistor. With the source 44 of this N channel transistor relatively negative and the drain 46 relatively positive, current can flow through the conduction channel of this transistor. The conductor 40 operates as the gate electrode of the transistor. The more positive the voltage applied to this gate electrode, the greater the conduction through the conduction channel. The voltage $V_A$ applied to this gate electrode is shown as being tapped from a potentiometer 53, one terminal of which is connected to a reference voltage source $V_x$, which may be at ground level or at a negative value such as the substrate voltage level, and the other terminal of which receives a positive voltage +V. The value chosen for the voltage $V_A$ will depend on such parameters as the operating temperature. At room temperature, $V_A$ may be about +15 volts for an integrating voltage of +3 volts, a voltage applied to electrodes 44 and 47 of −4 volts, and a substrate voltage of −2 volts.

There are a number of different modes of operation which are possible. In one mode, $V_A$ may be on continuously. In another mode, the controllable DC voltage source 42 of FIG. 4 may apply a voltage pulse $V_A$ at the proper positive level only after the optical integration time and during the A-to-B transfers. During the integration time, the voltage $V_A$ may be reduced in value to ground or to say −2 volts or so. A possible advantage of pulsed operation is a reduction the gap currents and a corresponding lessening of any tendency of the chip to increase in temperature due to such currents; however, the amount of heating, at usual operating temperatures isn't significant. Accordingly, so far as can be presently determined, operation with the control electrode receiving a positive voltage $V_A$ continuously is preferred as the circuit simpler than one for pulsed operation.

Figure 5:
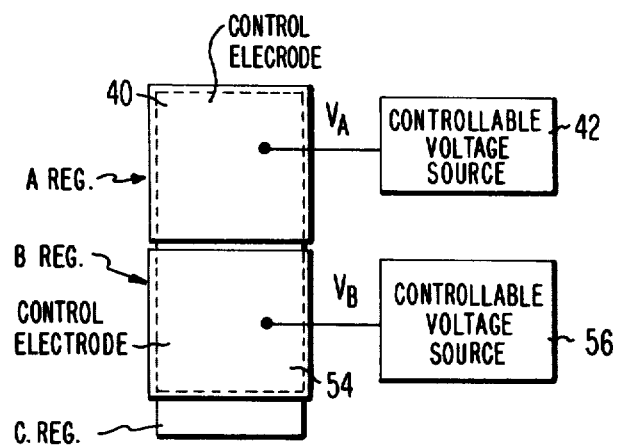
FIG. 5 is a plan view of an imager embodying the invention.

What has just been described is the control of gap leakage in the A register. In a preferred form of the invention, there is one control electrode 40 over the A register and a separate control electrode 43 over the B register as shown in FIG. 5. Electrode 54 is insulated from electrode 40 and from the gate electrodes of the B register. The voltage of control electrode 40 is controlled by a first controllable voltage source 42 and the voltage of the control electrode 54 is controlled by a second controllable voltage source 56. Separate electrodes and separate control of these electrodes is desirable as the amount of gap leakage induced in the A register for controlling mottling may be different than the amount of leakage employed in the B register for controlling sparkle.

The control of the gap current in the B register in the manner described eliminates or at least greatly reduces the sparkle; however, the reasons are not completely understood. The theory is that the sparkle is in some way associated with charging of the gaps in the B register combined with the modulation of the gap potential by signal charge, and that by controlling the gap current by a positive voltage applied to the control electrode 54, these charging effects are reduced as is the sparkle.

It is desirable to maintain the gap leakage current constant over a wide temperature operating range. If the control voltages $V_A$ and $V_B$ are obtained open-loop fashion, for example by means of a potentiometer, to obtain optimum operation the setting of the potentiometer will have to be varied as temperature varies. The variation should be in a sense to make the control voltages $V_A$ or $V_B$ more positive as the temperature decreases. This is to compensate for increased PN junction impedance which manifests itself as an increased conduction path impedance of the transistors, such as 50 of FIG. 6, simulated by adjacent gate electrodes. With increase in temperature, $V_A$ and $V_B$ are made less positive to decrease the current flow through the gaps.

FIG. 7 illustrates one way of achieving automatic control of the control electrode 40 voltage. An inductive loop 60 is coupled to a lead such as 62 which connects to one of the gate electrodes such as 44. The loop may comprise a ferrite core with windings around it with the lead 62 passing through the core. The loop 60 connects to an amplifier 64. The output of the amplifier is applied to a buffer amplifier 66 through a coupling capacitor 68. The input terminal of the buffer amplifier 66 is connected to a point of reference potential, shown as ground, through a keyed clamp illustrated as a switch 70. In practice, this switch and the others illustrated may be, for example, transistors such as field-effect transistors connected to operate as transmission gates.

The output of buffer amplifier 66 is applied through a switch 72 to the inverting terminal of differential amplifier 74. A holding capacitor 76 of relatively large value (for example, 100 picofarads) is connected between this inverting terminal and ground. The non-inverting terminal of amplifier 74 is connected to a tap on potentiometer 78. The latter is connected at one terminal to a DC voltage source $V_{DC}$ and at its other terminal to ground. The output of differential amplifier 74 is applied to the control electrode 40.

The operation of the circuit of FIG. 7 may be better understood by referring to the waveforms of FIG. 9. The multiple-phase voltages shown are those which are present during the A register-to-B register transfer time. As mentioned in the introductory portion of this application, the A-to-B transfer occurs during the vertical retrace time of television. The frequency of the multiple-phase voltages is relatively high—approximately 250 kHz in the case of the SID imager referred to previously. The voltage induced in the loop 60 is applied to the amplifier 64 which produces an output voltage $V_{A1}$ at an appropriate amplified voltage level. The output voltage is as shown in FIG. 9. It comprises a positive peak corresponding to the leading edge of the $\phi_{A1}$ waveform followed by a decaying portion followed by a negative peak corresponding to the lagging edge of the $\phi_{A1}$ waveform. The leakage current passing between the electrode 44 and a gap adjacent thereto, which corresponds to the current passing through the conduction path of a transistor such as illustrated in FIG. 6, is manifested as a displacement between the base line of the $V_{A1}$ waveform and the portion thereof occurring between the positive and negative peaks. This is the portion shown in FIG. 9 which occurs between the period $t_3$ and $t_4$. The greater the leakage current, the greater the amplitude of $V_L$, as illustrated in FIG. 9.

The voltage waveform $V_{A1}$ at the output of the amplifier 64 has to be clamped to some reference level to obtain suitable operation. Such clamping is achieved by keyed clamp 70. The waveform $V_{A1}$ is applied to the keyed clamp through coupling capacitor 68. During an appropriate interval of time such as $t_1$-$t_2$, during the base line portion of $V_{A1}$, the keyed clamp 70 is closed. In practice, the keying waveform may be derived from the $\phi_{A1}$ waveform and applied to the gate electrode of the transistor performing the function of switch 70. This keying waveform occurs once each period of $\phi_{A1}$ during the A-to-B transfer time.

The clamped waveform is passed through buffer amplifier 66, the purpose of which is to isolate its output from the preceding stages. This waveform is passed through switch 72 which is closed once each period of $\phi_{A1}$ during the interval $t_3$-$t_4$. As in the previous case, the keying waveform readily is obtained from the $\phi_{A1}$ waveform and it is produced once each period of $\phi_{A1}$ during the A-to-B transfer time.

The positive pulses produced in the manner described above are applied to holding capacitor 76 and they charge the capacitor to a DC level. The capacitor is connected to a high input impedance differential amplifier and it retains the charge imparted thereto through the switch 72 for a relatively long period of time. As indicated, the circuit of FIG. 7 is operative only during the A-to-B transfer time which is a relatively small portion of a field time. For the remainder of each field time, corresponding to the integration time, the switch 72 remains open and the charge stored on capacitor 76 remains at its fixed level.

The difference amplifier 74 compares the DC level across capacitor 76 with the reference voltage $V_{REF}$ and in response to the difference, controls the output voltage $V_A$ it supplies to the control electrode 40. Assuming amplifiers 64 and 66 both to be non-inverting amplifiers, if, for example, the temperature of the imager should decrease and the gap leaking current tend to decrease accordingly, the leakage voltage $V_L$ of FIG. 9 will tend to decrease. The charge supplied to and stored in capacitor 76 will tend to decrease accordingly so that the voltage applied to the inverting terminal of differential amplifier 74 will tend to decrease. This will result in the voltage applied to control electrode 40 increasing and this, in turn, will tend to increase the gap leakage current to return it to its initial value. The feedback loop, in other words, tends to stabilize the circuit operation in the sense of maintaining the gap leakage current constant. Any tendency for the gap leakage current to change results in a change in the voltage $V_A$ in a sense to prevent such gap leakage current change.

The value selected for the gap leakage current can be controlled by adjustment of $V_{REF}$. The value selected for $V_{REF}$ for controlling mottling, that is, the value selected for the A register may not be the same as that required for the B register for controlling sparkle. The control circuit for the B register will, in other respects, be the same as that shown in FIG. 7. The loop 60 will be coupled to one of the B register electrodes such as a $\phi_{B1}$ electrode and the differential amplifier 74 for the B register controllable voltage source 56 (FIG. 5) would be connected to the control electrode 54 for the B register.

While in the discussion above, it is stated that amplifiers 64 and 66 are assumed both to be non-inverting amplifiers, alternatives are possible. For example, both can be inverting amplifiers.

FIG. 8 illustrates another form of feedback circuit which may be used instead of the FIG. 7 circuit. In FIG. 8 the sensing element is a relatively small value of resistance 80 in series with the lead to an electrode such as 44, rather than pick-up loop 60. The resistance should have a value which is sufficiently small that the CCD operation isn't adversely affected. In one design (for the RCA SID 52501), 25 ohms was found to be suitable. The $\phi_{A1}$ terminal 82 on one side of the resistance connects to the base electrode of an emitter-follower amplifier 84. The other terminal 86 of the sensing resistance 80 connects to the base electrode of an emitter-follower amplifier 88. The output terminal 90 of amplifier 84 is connected through switch 92 to holding capacitor 94. The output terminal 96 of amplifier 88 connects through switch 98 to holding capacitor 100. The capacitors are connected between ground and the inverting and non-inverting terminals, respectively, of a first differential amplifier 102, and the output of this amplifier connects to the inverting terminal of a second differential amplifier 104.

In the operation of the circuit of FIG. 8, the output $V'_{A1}$ of emitter-follower amplifier 84 is shown dotted in the last waveform of FIG. 9. It is a replica of the $\phi_{A1}$ waveform. The output $V''_{A1}$ of emitter-follower amplifier 88 is as shown in solid line in the last waveform of FIG. 9. The difference in amplitude $V'_L$ between these two waveforms during a period such as $t_3-t_4$, is proportional to the leakage current.

The switches 92 and 98 are closed only during each period $t_3-t_4$ of the $\phi_{A1}$ waveform during the A-to-B transfer time. During the integration time, the switches 92 and 98 are open. The capacitors 94 and 100 are charged through the switches 92 and 98 and each capacitor assumes a different charge level. Capacitor 94 becomes charged to a higher level proportional to the amplitude of the $V'_{A1}$ wave and capacitor 100 becomes charged to a lower level proportional to the amplitude of the $V''_{A1}$ wave. The difference in charge levels is proportional to the gap leakage current as is the difference in the voltages produced by these charge levels. The two voltages are applied to the input terminals of a amplifier 102. The output voltage of amplifier 102 is compared with the level $V_{REF}$ by the difference amplifier 104. Its output is the DC level applied to the control electrode 40.

The operation of FIG. 8 is such as to stabilize the leakage current at the desired level. If the leakage current should tend to decrease, the difference in charges stored in capacitors 94 and 100 is decreased correspondingly. This will result in a decrease in the voltage applied to the inverting terminal of amplifier 104. This, in turn, will result in an increase in $V_A$, that is, $V_A$ will become more positive. Increasing the voltage $V_A$ will result in an increase in the leakage current such as to return it to its design value. Thus, any tendency of the leakage current to change is sensed by the circuit of FIG. 8 and results in change in voltages in such a way as to maintain the leakage current constant.

As in the embodiment of FIG. 7, a circuit such as shown in FIG. 8 will also be employed for the B register. It may be connected to one of the B register electrodes such as a $\phi_{B1}$ electrode. Further, $V_{REF}$ may be at a different value for the B register circuit than for the A register circuit. The output of the FIG. 8 circuit used with the B register is applied to electrode 54 for controlling the voltage of that electrode.

While for purposes of the present explanation the CCD imager has been illustrated in terms of a surface channel B register and a surface channel A register, it can be employed with a surface channel A register and a buried channel B register. In this form of imager, sparkle is relatively low over a relatively wide temperature range so that here one may desire to operate with a control electrode such as 40 for the A register and no control electrode for the B register. Further, the C register may be either of the buried or the surface channel type. Also, while a three-phase system is illustrated, the invention is equally applicable to two, four or higher phase systems and the claims are intended to be generic to all such systems.

In the foregoing explanation it is assumed that the A register is illuminated through its gate electrodes. When operated in this way, the control electrode 40 should be transparent and can be formed of a material such as tin oxide. The control electrode 54 over the B register can be formed of the same material; however, if desired, it can instead be formed of an opaque material such as aluminum. On the other hand, if back surface illumination is employed which normally would be the case with thinned substrate A registers, then the control electrodes may be opaque.

What is claimed is:

1. A charge-coupled device (CCD) imager comprising:

a semiconductor substrate;

a single layer electrode structure lying over and insulated from one surface of said substrate, said structure comprising semiconductor electrodes of one conductivity type spaced from one another by semiconductor "gaps" of opposite conductivity type;

means for controlling, at a desired level, greater than zero, the conduction of current through the gaps comprising a control electrode lying over the surface of and insulated from the single layer electrode structure, said control electrode covering both the electrodes and gaps; and means for applying a control voltage to said control electrode of a sense and amplitude to produce current flow at said desired level through said gaps during operation of said imager, said means for applying a control voltage comprising means for applying a DC level, open-loop fashion.

2. A charge-coupled device (CCD) imager comprising:

a semiconductor substrate;

a single layer electrode structure lying over and insulated from one surface of said substrate, said structure comprising semiconductor electrodes of one conductivity type spaced from one another by semiconductor "gaps" of opposite conductivity type;

means for controlling, at a desired level, greater than zero, the conduction of current through the gaps comprising a control electrode lying over the surface of and insulated from the single layer electrode structure, said control electrode covering both the electrodes and gaps; and means for applying a control voltage to said control electrode of a sense and amplitude to produce current flow at said desired level through said gaps during operation of said imager, said means for applying a control voltage comprising feedback circuit means for supplying said control voltage at a controllable level such as to maintain said conduction of current through the gaps at a substantially constant level over a relatively wide temperature range.

3. A charge-coupled device (CCD) imager comprising:

a semiconductor substrate;

a single layer electrode structure lying over and insulated from one surface of said substrate, said structure comprising semiconductor electrodes of one conductivity type spaced from one another by semiconductor "gaps" of opposite conductivity type;

means for controlling, at a desired level, greater than zero, the conduction of current through the gaps comprising a control electrode lying over the surface of and insulated from the single layer electrode structure, said control electrode covering both the electrodes and gaps; and means for applying a control voltage to said control electrode of a sense and amplitude to produce current flow at said desired level through said gaps during operation of said imager, said means for applying a control voltage comprising:

means for sensing the conduction of current through at least one of said gaps; and means responsive to any tendency of said current to change from said desired value for varying the value of said control voltage in a sense and amount to return the flow of said current through said at least one gap to said desired value.

4. In a charge-coupled device (CCD) imager of the field-transfer type comprising:

a CCD A register including a substrate formed with channels extending in a column direction, the opposite edges of each channel being defined by potential barriers in the substrate for confining any charge which may be present in a channel to the channel, said A register also having electrodes extending in a row direction substantially orthogonal to said column direction, over said channels, responsive to applied voltages for the storage in and transfer of charges along said channels, said register for producing and storing charge signals in response to a radiation image projected onto said register;

a CCD B register coupled to the A register and into which a field of charge signals from said A register may be shifted for temporary storage in said B register, said B register including a substrate formed with channels aligned with corresponding channels of the A register, the opposite edges of each such channel in said B register also being defined by potential barriers in the substrate for confining any charge which may be present in a channel to that channel, said B register having electrodes extending in the row direction over the channels of said B register responsive to applied multiple phase voltages for the storage in and transfer of charge along the channels of said B register;

said electrodes of said A and B registers being of the single layer type and comprising semiconductor material of one conductivity type and being separated from one another by "gaps" formed of semiconductor material of opposite conductivity type; and a control electrode insulated from the electrodes of the A register and overlying both said electrodes and the gaps between said electrodes, said control electrode for receiving a control voltage for controlling the conduction through said gaps.

5. In a CCD imager as set forth in claim 4, further including:

means responsive to current passing through at least one of said gaps between electrodes of said A register for supplying said control voltage to said control electrode at a level to maintain said current constant.

6. In a CCD imager as set forth in claim 4, further including:

a second control electrode, this one insulated from the electrodes of the B register and from the control electrode over the A register, said second control electrode overlying the electrodes of the B register and the gaps between the electrodes of the B register, said second control electrode for receiving a second control voltage for controlling the conduction through said gaps between the electrodes of the B register.

7. In a CCD imager as set forth in claim 6, further including:

first means responsive to current passing through at least one of the gaps between electrodes of said A register for supplying said control voltage to said control electrode over the electrodes of the A register at a level to maintain said current passing through said gaps between electrodes of the A register at a substantially constant value; and second means responsive to current passing through at least one of the gaps between electrodes of said B register for supplying said second control voltage at a level to maintain the current passing through the gaps between electrodes of the B register at a substantially constant value.

* * * * *